United States Patent [19]

Redmond

[11] Patent Number: 4,819,041
[45] Date of Patent: Apr. 4, 1989

[54] SURFACE MOUNTED INTEGRATED CIRCUIT CHIP PACKAGE AND METHOD FOR MAKING SAME

[75] Inventor: John P. Redmond, Mechanicsburg, Pa.

[73] Assignee: AMP Incorporated, Harrisburg, Pa.

[21] Appl. No.: 567,210

[22] Filed: Dec. 30, 1983

[51] Int. Cl.⁴ .............................. H01L 39/02
[52] U.S. Cl. ..................................... 357/80
[58] Field of Search ................. 357/70, 72, 74, 80

[56] References Cited

U.S. PATENT DOCUMENTS

| | | | |
|---|---|---|---|
| 4,024,570 | 5/1977 | Hartmann et al. | 357/70 |
| 4,215,359 | 7/1980 | Schermer et al. | 357/70 |
| 4,218,701 | 8/1980 | Shirasaki | 357/80 |

*Primary Examiner*—William L. Sikes
*Assistant Examiner*—Robert E. Wise

[57] ABSTRACT

A surface mountable integrated circuit chip package is taught. Briefly stated, a flexible laminate having conductive strips thereon is wrapped around a heat sink. Plastic is molded around the laminate-heat sink piece, with a window left in the center thereof, which coincides with a window in the laminate. An integrated circuit chip is then bonded to the heat sink with wire leads then run from the chip to the conductive strips on the laminate. A potting material is then placed in the window thereby completely encapsulating the integrated circuit chip so as to prevent exposure to environmental or physical damage. This thereby forms a package which is surface mountable to a circuit board through attachment techniques such as the vapor phase soldering.

12 Claims, 2 Drawing Sheets

SURFACE MOUNTED INTEGRATED CIRCUIT CHIP PACKAGE AND METHOD FOR MAKING SAME

BACKGROUND OF THE INVENTION

This invention relates, generally, to an integrated circuit package and more particularly to a surface mounted integrated circuit chip package.

Attendant with the ever increasing use of integrated circuits in high volume, low setting price items is the necessity to eliminate the number of components or parts of any type as well as a lessening of manufacturing steps. Accordingly, surface mounting of components is becoming increasingly popular in order to decrease the cost of circuit boards as well as socketing requirements. However, a number of problems arise in the implementation of surface mounting of integrated circuit chip packages. This problems encompass cost, space problems as well as heat dissipation or heat sink considerations. Further, many schemes make it difficult to test a wire bounded chip before actual mounting. Accordingly, it is advantageous to have a surface mounted integrated circuit chip package which is extremely low in cost, provides a down sizing of circuit board space requirements, will allow for heat sinking as well as a variety of attachment methods to a circuit board and testing before surface mounting. Such a device is taught by the present invention.

Accordingly, the present invention teaches and as an object of the present invention a surface mountable integrated circuit chip package, comprising a mounting base, a flexible laminate having conductive strips thereon, the laminates being conformally disposed on the base so as to at least partially wrap around the base, a molded frame, having a window therein, disposed around the outer portions of the laminate so as to fixedly hold the laminate to the base, an integrated circuit chip disposed in the window, the chip having pads thereon which are electrically interconnected with the conductive strips, and an encapsulation portion disposed over the window for sealing the chip in the window.

BRIEF DESCRIPTION OF THE DRAWINGS

Reference is now made to the accompanying drawings in which.

DESCRIPTION OF THE PREFERRED EMBODIMENT

Figure 1:
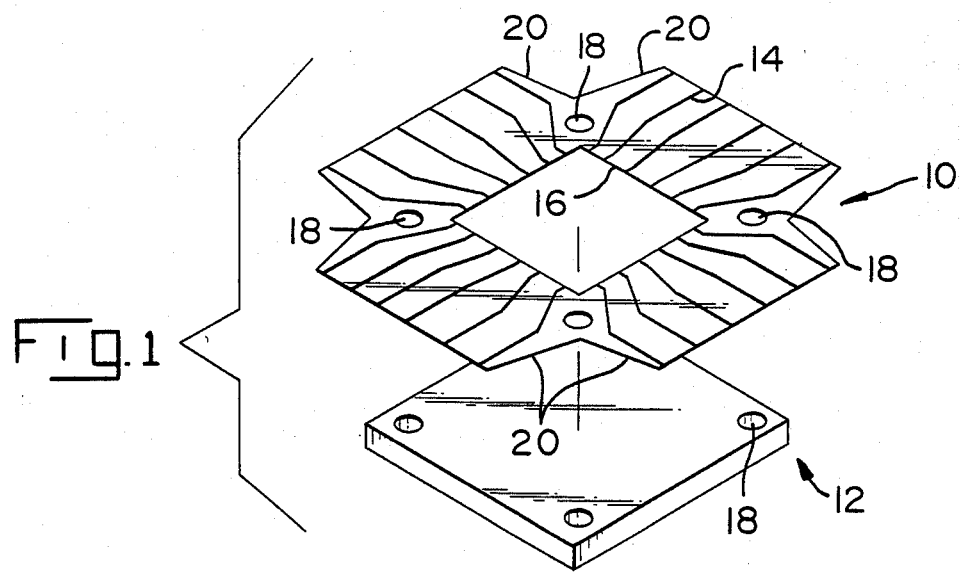
FIGS. 1 through 5 are isometric views illustrating the various steps utilized in producing the present invention.
Figure 2:
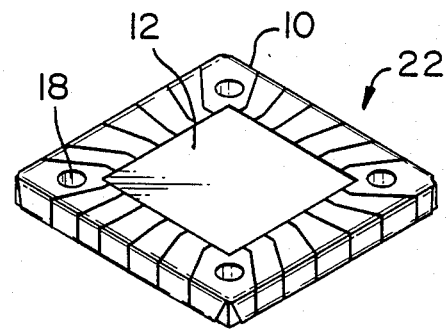
Figure 4:
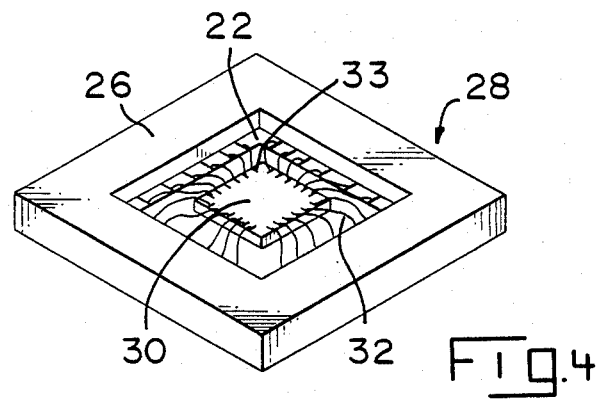

Referring now to FIG. 1 there is shown a flexible laminate shown generally at 10 which in the referred embodiment of the present invention is a double-sided thin printed circuit which is flexible thereby allowing it to be wrapped around another object as shown more clearly in FIG. 2. The laminate 10 in the preferred embodiment of the present invention is composed of a two mil thick polyimide which has copper on one side. The copper is plated with a nickel-gold plate which is then copper etched thereby making circuit traces and which is known to those skilled in the art. The laminate 10 has disposed thereon conductive strips 14 which are generally disposed on one side of the laminate 10 but may be disposed on both sides. A center aperture 16 is disposed in the laminate 10 which facilitates placement of an integrated circuit chip (as shown in FIG. 4). Positioning apertures 18 are disposed in the laminate 10 which are utilized to center as well as hold the laminate to the heat sink 12. A cutout 20 is disposed in each corner of the laminate 10 and which is utilized to avoid overlapping of portions of the laminate 10 when it is disposed or wrapped around the heat sink (as shown in FIG. 2). A heat sink or mounting base 12 is utilized to provide structural integrity to the entire device as well as facilitating placement of an integrated circuit (not shown) and in the preferred embodiment of the present invention is used for heat sink purposes. However, it is to be understood that other material such as ceramic may be utilized without departing from the spirit and scope of the present invention.

Referring now to FIG. 2 there is shown a formed piece 22 wherein the laminate 10 is formed around the heat sink 12. Clearly shown is how the positioning apertures 18 which are disposed in the laminate 10 as well as the heat sink 12 are in alignment thereby providing a visual as well as manufacturing advantage.

Figure 3:
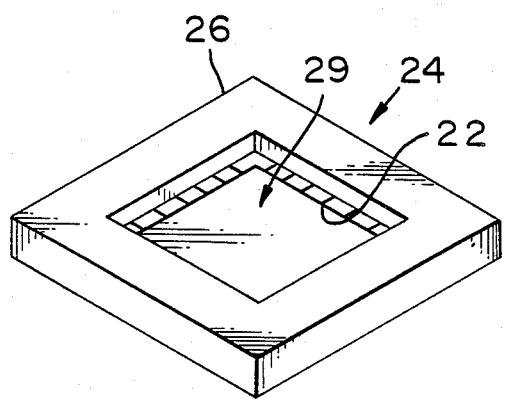

Referring now to FIG. 3 there is shown a molded piece shown generally at 24 which is comprised of the formed piece 22 having plastic 26 molded thereto. This thereby holds the laminate 10 in place with the plastic 26 also disposed in the apertures 18 (not shown). It is to be understood however that the laminate 10 may have an adhesive on its underside to facilitate bonding to the heat sink 12 but may also use other methods such as copper on the underside of the laminate 10 which would use solder to bond the laminate 10 to the base 12. The molded piece 24 has a window 29 disposed therein which thereby allows for and simplifies mounting and encapsulation as shown more clearly in FIGS. 4, 5 and 6. The plastic 26 in the preferred embodiment of the present invention is a thermosetting material such as an epoxy or phenolie, but may be a high tempature thermoplastic such as a polyphenylene sulfide or a poly ethylene trephthalate (PET) or a polyetherimide, all of which are well known to one skilled in the art as well as the molding and application thereof.

Referring now to FIG. 4 there is shown a mounted chip assembly shown generally at 28 wherein an integrated circuit chip 30 has been bonded to the heat sink 12. Wire leads 32 have been attached to pads 33, disposed on the integrated circuit chip 30 and to the conductive strips 14 in a bonding down fashion. This thereby allows electrical communication between the integrated circuit chip 30 and the conductive strips 14. Additionally, heat sink capabilities are provided via the mounting base 12. It is to be understood however that direct mounting of the integrated circuit chip 30 may be made to the laminate 10 through the use of conductive glues wherein the center aperture 16 is made slightly smaller than the area defined by the pads 33.

Figure 5:
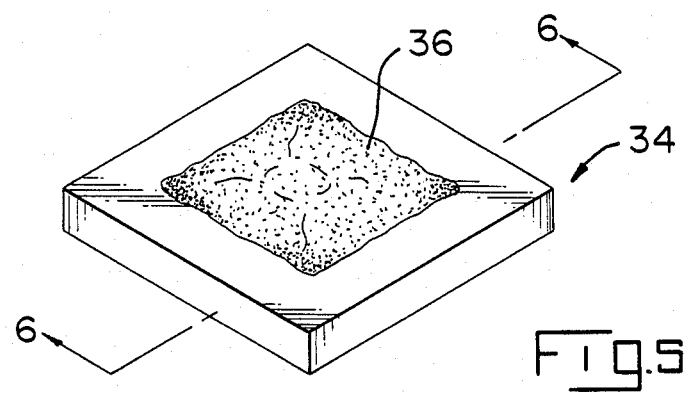

Referring now to FIG. 5, there is shown an encapsulated package 34 which is ready for attachment to a circuit board. Here it can be seen that the interior portion of the molded piece 24 has a lid which in the preferred embodiment of the present invention is an encapsulating epoxy 36. This therefore provides physical as well as environmental protection to the integrated circuit and the leads connected thereto.

Figure 6:
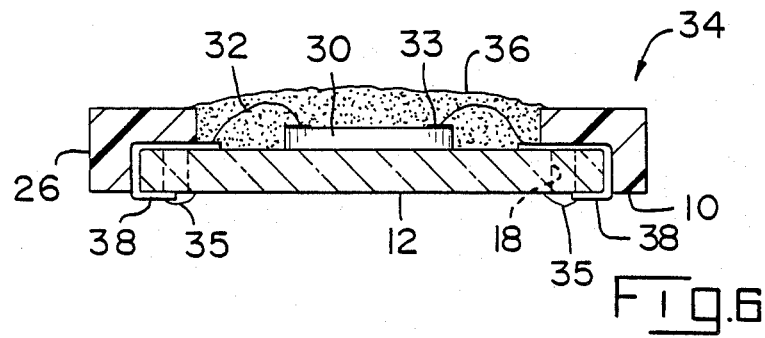
FIG. 6 is cross-sectional view taken through FIG. 5 illustrating in more detail the construction of the present invention.

Referring now to FIG. 6, there is shown a cross-sectional view taken through the package of FIG. 5. Readily apparent how the laminate 10 is disposed around the sink or base 12 with the plastic 26 molded therearound and in the apertures 18 which thereby forms buttons 35 on the underside of the package 34. This therefore more firmly holds the laminate 10 to the heat sink 12. Also evident is how the encapsulating material 36 has completely filled the area defined by the interior portion of the plastic 36. Mounting areas shown generally at 38 allow for soldering to occur between the portion of the conductor strips disposed under the package 34 to a circuit board such as a printed circuit or silk screened board (not shown). This soldering is, in the preferred embodiment of the present invention, through the use of vapor phase soldering. It is to be understood that other types of attachment such as glues may be utilized.

Therefore, in the manner heretofore described testing of the integrated circuit chip may be done in the mounted chip assembly stage 28 (shown in FIG. 4) or the package stage 34 (shown in FIG. 5) as desired.

It is to be understood that many variations of the present invention may be utilized without departing from the spirit scope of the present invention. For example, different encapsulation methods may be utilized such as a lid which fits over the opening in the package or the entire package with a silicone grease disposed thereunder to protect the chip. Also, different means of positioning the laminate to the heat sink other than apertures may be used while different shapes of laminates or conductive strip spacing between adjacent sides may be utilized. Further, different methods of firmly holding the plastic to the formed piece may be utilized such as glues or metal or plastic screws. Additionally, the base may be of a different configuration such as, for example, a recess in the base where the chip is placed or the base bent appropriately to present a recess for the chip. This would thereby allow for a bonding up situation for the wire leads, since the pads on the chip would be lower than the conductive strips on the laminate.

Therefore, in addition to the above-enumerated advantages, the disclosed invention produces a surface mountable integrated circuit chip package which is relatively inexpensive to manufacture, providing numerous steps for testing and which occupies a minimum of circuit board real estate.

I claim:

1. A surface mountable integrated circuit chip package, comprising:
   a mounting base;
   a separate flexible laminate having conductive strips thereon, said laminate being conformally disposed on said base so as to at least partially wrap around said base;
   a molded frame, having a window therein which is disposed around the outer portions of said laminate, so as to fixedly hold said laminate to said base;
   an integrated circuit chip disposed in said window, said chip having pads thereon which are electrically interconnected with said conductive strips; and
   an encapsulation portion disposed over said window for sealing said chip in said window.

2. A device according to claim 1 wherein said flexible laminate has an aperture therein which thereby facilitates bonding of said integrated circuit chip to said base.

3. A device according to claim 1 wherein said mounting base is comprised of a heat sink.

4. A device according to claim 3 wherein said heat sink is comprised of a metal.

5. A device according to claim 1 wherein said mounting base is comprised of a ceramic.

6. A device according to claim 1 wherein said molded frame is comprised of a plastic.

7. A device according to claim 1 wherein positioning apertures are disposed in said flexible laminate and said mounting base so as to provide alignment between said laminate and said mounting base as well as providing a means for more rigidly attaching said frame to said laminate and said base.

8. A device according to claim 1 wherein said integrated circuit chip package is disposed on a circuit board wherein conductive strips disposed on said circuit board are in alignment with said conductive strips disposed on said flexible laminate so as to provide electrical communication between said integrated circuit chip and said conductive strips on said circuit board.

9. A device according to claim 1 wherein said encapsulation portion is comprised of an epoxy which is disposed in said window.

10. A device according to claim 1 wherein said encapsulation portion is comprised of a lid disposed over said window.

11. A method for making a surface mountable integrated circuit chip package, comprising the steps of:
   a. placing a separate flexible laminate having conductive strips thereon on said mounting base so as to at least partially conformally wrap therearound;
   b. molding a frame, having a window therein, around the outer portion of said laminate;
   c. attaching an integrated circuit chip in said window to said base;
   d. attaching electrically conductive leads between pads contained on said integrated circuit chip and said conductor strips; and
   e. encapsulating the window portions and thereby the integrated circuit chip contained on the base.

12. A method according to claim 11 comprising the additional step of attaching said integrated circuit chip package to a circuit board wherein said conductive strips contained on said flexible laminate are in alignment with said conductive strips on said circuit board.

* * * * *